United States Patent
Tseng et al.

(10) Patent No.: US 9,620,551 B2
(45) Date of Patent: *Apr. 11, 2017

(54) MECHANISMS FOR FORMING BACKSIDE ILLUMINATED IMAGE SENSOR DEVICE STRUCTURE

(71) Applicant: TAIWAN SEMICONDUCTOR MANUFACTURING CO., LTD., Hsinchu (TW)

(72) Inventors: Chung-Chuan Tseng, Hsinchu (TW); Chia-Wei Liu, Zhubei (TW); Li-Hsin Chu, New Taipei (TW); Yu-Hsiang Tsai, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/053,829

(22) Filed: Feb. 25, 2016

(65) Prior Publication Data

US 2016/0172392 A1 Jun. 16, 2016

Related U.S. Application Data

(62) Division of application No. 14/037,890, filed on Sep. 26, 2013, now Pat. No. 9,281,336.

(51) Int. Cl.
*H01L 27/146* (2006.01)
*H01L 31/112* (2006.01)

(52) U.S. Cl.
CPC ...... *H01L 27/1464* (2013.01); *H01L 27/1462* (2013.01); *H01L 27/1463* (2013.01); *H01L 27/14612* (2013.01); *H01L 27/14621* (2013.01); *H01L 27/14625* (2013.01); *H01L 27/14627* (2013.01); *H01L 27/14636* (2013.01); *H01L 27/14685* (2013.01); *H01L 27/14687* (2013.01);

(Continued)

(58) Field of Classification Search
None
See application file for complete search history.

(56) References Cited

U.S. PATENT DOCUMENTS

| 7,420,257 B2 | 9/2008 | Shibayama |
| 7,968,424 B2 * | 6/2011 | Lin ............... H01L 21/2652 257/E21.551 |

(Continued)

*Primary Examiner* — Andres Munoz
(74) *Attorney, Agent, or Firm* — Birch, Stewart, Kolasch & Birch, LLP (57) ABSTRACT

A backside illuminated image sensor device structure and methods for forming the same are provided. The method for manufacturing a backside illuminated image sensor device structure includes providing a substrate and forming a polysilicon layer over the substrate. The method further includes forming a buffer layer over the polysilicon layer and forming an etch stop layer over the buffer layer. The method further includes forming a hard mask layer over the etch stop layer and patterning the hard mask layer to form an opening in the hard mask layer. The method further includes performing an implant process through the opening of the hard mask layer to form a doped region in the substrate and removing the hard mask layer by a first removing process. The method further includes removing the etch stop layer by a second removing process and removing the buffer layer by a third removing process.

20 Claims, 5 Drawing Sheets

(52) U.S. Cl.
CPC .... *H01L 27/14689* (2013.01); *H01L 31/1126* (2013.01)

(56) References Cited

U.S. PATENT DOCUMENTS

| | | |
|---|---|---|
| 8,809,172 B2 | 8/2014 | Li et al. |
| 8,994,135 B2 | 3/2015 | Yamamura et al. |
| 9,281,336 B2 * | 3/2016 | Tseng ................. H01L 27/1464 |
| 2006/0011996 A1 | 1/2006 | Wu et al. |
| 2007/0152250 A1 | 7/2007 | Kim |
| 2007/0249077 A1 | 10/2007 | Sze et al. |
| 2009/0280621 A1 | 11/2009 | Endo et al. |
| 2010/0026866 A1 * | 2/2010 | Matsumoto ....... H01L 27/14609 348/308 |
| 2011/0084350 A1 | 4/2011 | Murakoshi et al. |
| 2011/0171804 A1 | 7/2011 | Wang et al. |
| 2012/0038017 A1 | 2/2012 | Hsu et al. |
| 2012/0319242 A1 | 12/2012 | Mao et al. |
| 2013/0285131 A1 | 10/2013 | Matsumoto et al. |
| 2013/0320418 A1 * | 12/2013 | Tseng ................ H01L 27/14603 257/290 |
| 2013/0320420 A1 * | 12/2013 | Kao ....................... H01L 31/02 257/292 |

* cited by examiner

MECHANISMS FOR FORMING BACKSIDE ILLUMINATED IMAGE SENSOR DEVICE STRUCTURE

CROSS REFERENCE TO RELATED APPLICATIONS

This application is a Divisional application of co-pending Application Ser. No. 14/037,890, filed on Sep. 26, 2013, the entire content of which is hereby incorporated by reference.

BACKGROUND

Integrated circuit (IC) technologies are constantly being improved. Such improvements frequently involve scaling down device geometries to achieve lower fabrication costs, higher device integration density, higher speeds, and better performance.

One of the IC devices is an image-sensor device. An image-sensor device includes a pixel grid for detecting light and recording the intensity (brightness) of the detected light. The pixel grid responds to the light by accumulating charges. The charges can be used (for example, by other circuitry) to provide color in some suitable applications, such as a digital camera.

Common types of pixel grids include a charge-coupled device (CCD) image sensor or complimentary metal-oxide-semiconductor (CMOS) image sensor device. One type of image sensor devices is a backside illuminated (BSI) image sensor device. BSI image sensor devices are used for sensing a volume of light projected towards the back surface of a substrate. BSI image sensor devices provide a high fill factor and reduced destructive interference, as compared to front-side illuminated (FSI) image sensor devices. In general, BSI technology provides higher sensitivity, lower cross-talk, and comparable quantum efficiency as compared to FSI image sensor devices.

However, although existing BSI image sensor devices and methods of fabricating these BSI image sensor devices have been generally adequate for their intended purposes, as device scaling-down continues, they have not been entirely satisfactory in all respects.

BRIEF DESCRIPTION OF THE DRAWINGS

For a more complete understanding of the present disclosure and the advantages thereof, reference is now made to the following descriptions taken in conjunction with the accompanying drawings, in which.

DETAILED DESCRIPTION

The making and using of the embodiments of the disclosure are discussed in detail below. It should be appreciated, however, that the embodiments can be embodied in a wide variety of specific contexts. The specific embodiments discussed are merely illustrative, and do not limit the scope of the disclosure.

It is to be understood that the following disclosure provides many different embodiments, or examples, for implementing different features of the disclosure. Specific examples of components and arrangements are described below to simplify the present disclosure. These are, of course, merely examples and are not intended to be limiting.

Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows include embodiments in which the first and second features are formed in direct contact, and may also include embodiments in which additional features may be formed between the first and second features, such that the first and second features may not be in direct contact.

Some variations of the embodiments are described. Throughout the various views and illustrative embodiments, like reference numbers are used to designate like elements.

Mechanisms for forming an integrated circuit (IC) device are provided in accordance with some embodiments of the disclosure. The integrated circuit device may be an integrated circuit (IC) chip that includes various passive and active microelectronic components, such as resistors, capacitors, inductors, diodes, metal-oxide-semiconductor field effect transistors (MOSFETs), complementary MOS (CMOS) transistors, bipolar junction transistors (BJTs), laterally diffused MOS (LDMOS) transistors, high power MOS transistors, fin-like field effect transistors (FinFETs), or other applicable components.

In some embodiments, the IC device includes a backside illuminated (BSI) image sensor device structure. FIGS. 1A to 1J illustrate cross-section representations of various stages of manufacturing a BSI image sensor device structure 100 in accordance with some embodiments. However, it should be noted that FIGS. 1A to 1J have been simplified for the sake of clarity to better understand the inventive concepts of the present disclosure. Additional features can be added in BSI image sensor device structure 100, and some of the features described below can be replaced or eliminated. In addition, it should be noted that different embodiments may have different advantages than those described herein, and no particular advantage is necessarily required of any embodiment.

Figure 1A:
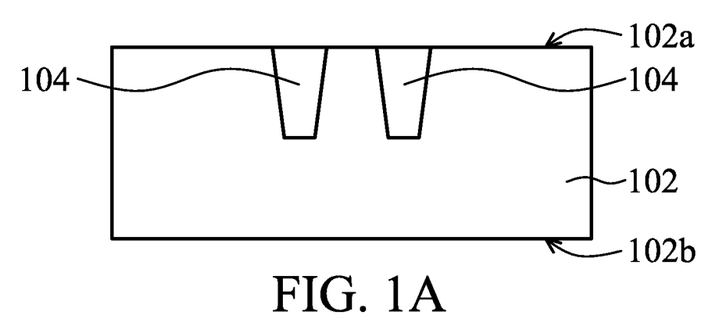
FIGS. 1A to 1J illustrate cross-section representations of various stages of forming a BSI image sensor device structure in accordance with some embodiments.

Referring to FIG. 1A, a substrate 102 is provided. In some embodiments, substrate 102 is a semiconductor substrate including silicon. Alternatively or additionally, substrate 102 may include elementary semiconductor materials (such as germanium and/or diamond), compound semiconductor materials (such as silicon carbide, gallium arsenic, gallium phosphide, indium phosphide, indium arsenide, and/or indium antimonide), or alloy semiconductor materials (such as SiGe, GaAsP, AlInAs, AlGaAs, GaInAs, GaInP, and/or GaInAsP.) Substrate 102 may be a p-type or an n-type substrate depending on the design requirements of BSI image sensor device structure 100. In some embodiments, substrate 102 is a device wafer.

As shown in FIG. 1A, substrate 102 has a front side 102a and a back side 102b. Shallow trench isolations (STI) 104 are formed in front side 102a of substrate 102 in accordance with some embodiments. In some embodiments, STI 104 are made of insulating materials, such as silicon dioxide. STI 104 may be formed by etching trenches in front side 102a of substrates 102 and filling an insulating material into the trenches by chemical vapor deposition (CVD) afterwards.

Figure 1B:
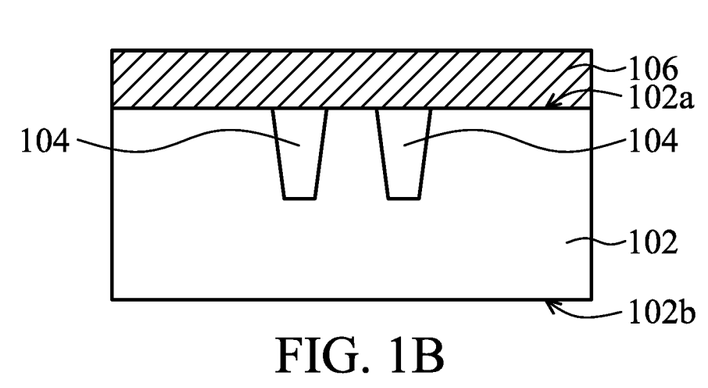

Next, a polysilicon layer 106 is formed over front side 102a of substrate 102, as shown in FIG. 1B in accordance with some embodiments. Polysilicon layer 106 may be formed by using applicable techniques including but not limited to CVD. In some embodiments, the thickness of polysilicon layer 106 is in a range from about 500 Å to about 1500 Å.

Figure 1C:
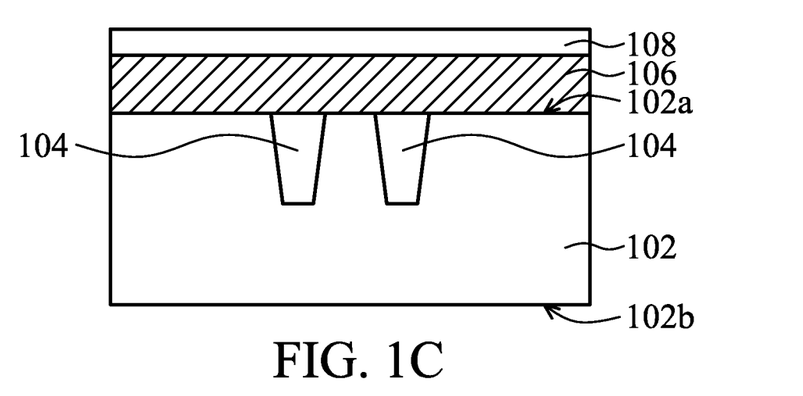

After polysilicon layer 106 is formed, a buffer layer 108 is formed over polysilicon layer 106. Buffer layer 108 is used to release the stress of polysilicon layer 106 (discussed in more detail later). In some embodiments, buffer layer 108 is an oxide layer. In some embodiments, buffer layer 108 is made of silicon dioxide, silicon oxide, aluminum oxide, lanthanum oxide, hafnium oxide, zirconium oxide, hafnium oxynitride, or other applicable oxide-containing materials. In some embodiments, the thickness of buffer layer 108 is in a range from about 80 Å to about 800 Å. When buffer layer 108 is too thin, the stress cannot be release. Acids used in subsequent processes may penetrate buffer layer 108 and permeate into polysilicon layer 106. When buffer layer 108 is too large, pixel implant profile may be abnormal, resulting in pixel performance shift.

Buffer layer 108 may be formed by any applicable oxidation process, such as wet or dry thermal oxidation processes or by a CVD process. For example, tetraethylorthosilicate (TEOS) and oxygen may be used as precursor during the CVD process to form buffer layer 108.

Figure 1D:
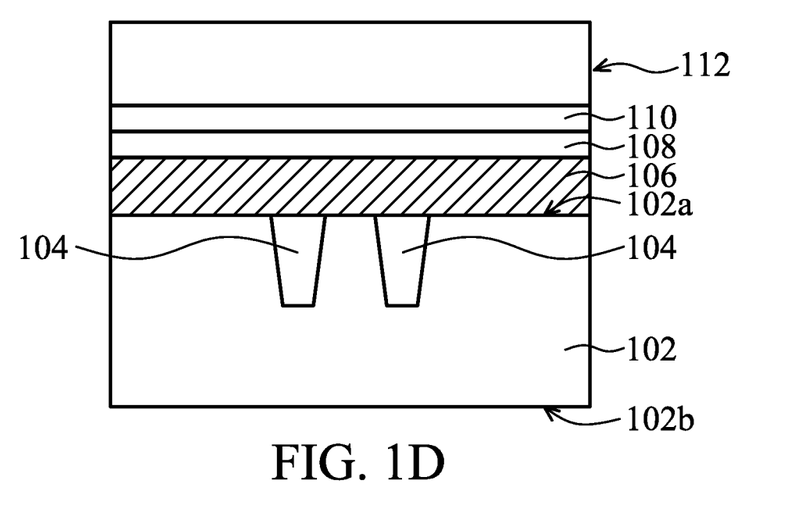

After buffer layer 108 is formed, an etch stop layer 110 is formed over buffer layer 108 over front side 102a of substrate 102, as shown in FIG. 1D in accordance with some embodiments. In some embodiments, etch stop layer 110 is a nitride layer. In some embodiments, etch stop layer 110 is made of silicon nitride. In some embodiments, the thickness of etch stop layer 110 is in a range from about 800 Å to about 2400 Å. Etch stop layer 110 may be formed by using applicable techniques including but not limited to CVD or physical vapor deposition (PVD).

Next, a hard mask layer 112 is formed over etch stop layer 110 in accordance with some embodiments. In some embodiments, hard mask layer 112 is made of silicon oxide. Hard mask layer 112 may be formed by using applicable techniques including but not limited to CVD or PVD.

Figure 1E:
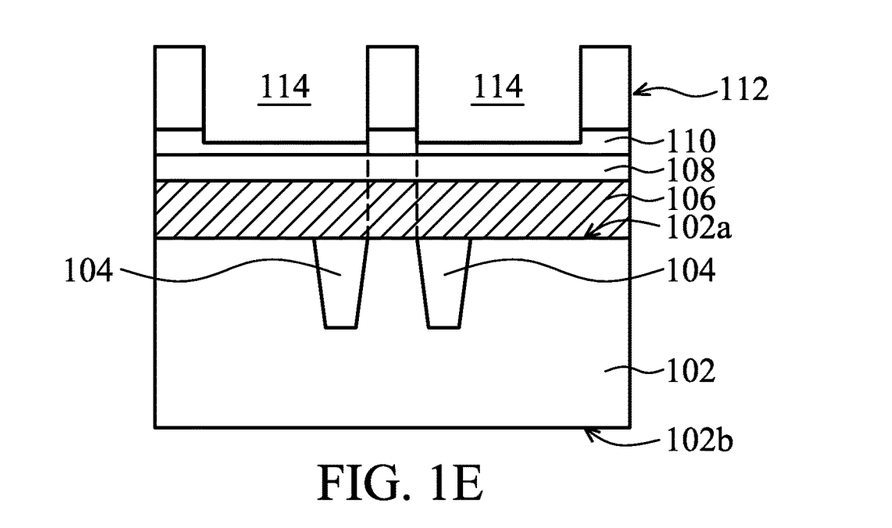

Afterwards, hard mask layer 112 is patterned, as shown in FIG. 1E in accordance with some embodiments. In some embodiments, hard mask layer 112 is patterned to remove portions of hard mask layer 112 and to form openings 114 in hard mask layer 112 by an etching process. In some embodiment, portions of etch stop layer 110 are also removed by the etching process. In some embodiments, an edge of opening 114 is substantially aligned with an edge of STI 104.

Figure 1F:
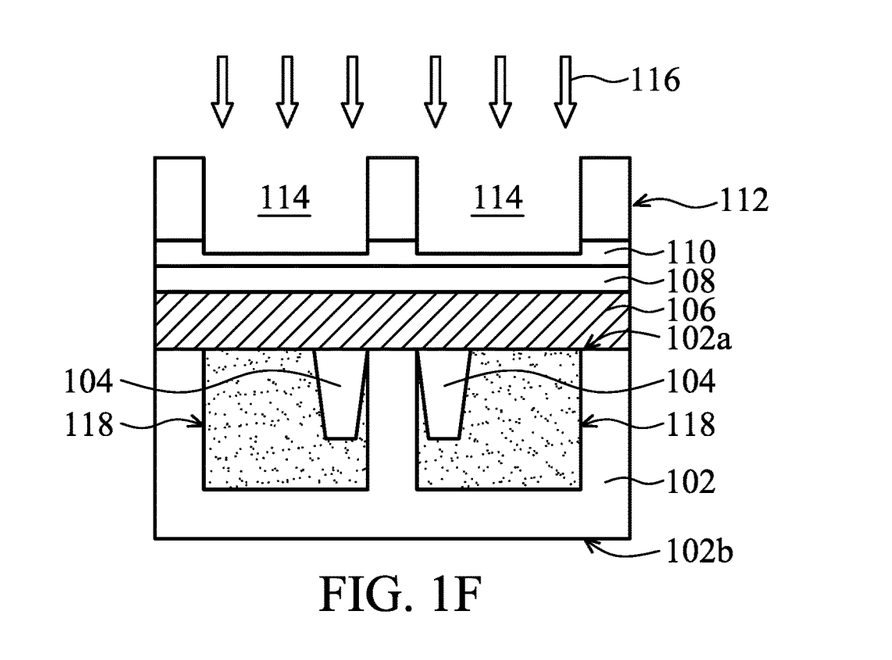

After hard mask layer 112 is patterned, an implant process 116 is performed to form doped regions 118 in front side 102a of substrate 102, as shown in FIG. 1F in accordance with some embodiments. More specifically, dopants are implanted in substrate 102 from opening 114 of hard mask layer 112 through portions of etch stop layer 110, buffer layer 108, and polysilicon layer 106. In some embodiments, doped regions 118 are radiation-sensing regions, which are operable to sense or detect radiation waves projected toward doped regions 118 through back side 102b of substrate 102.

Implant process 116 may include multiple implant operations and may use different dopants, implant dosages, and implantation energies during the operations. In some embodiments, implant process 116 includes doping substrate 102 with a dopant having an opposite doping polarity from substrate 102.

Figure 1G:
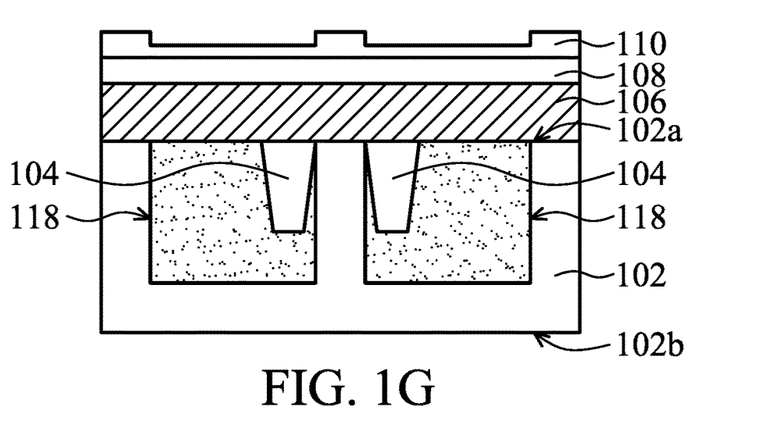

After doped regions 118 are formed, hard mask layer 112 is removed by a first removing process, as shown in FIG. 1G in accordance with some embodiments. In some embodiments, the first removing process includes using a solution containing acid. In some embodiments, the first removing process includes using a solution containing HF, and the concentration of HF is in a range from about 1% to about 50%.

Since the first removing process includes using a solution having a relatively high concentration of acid, buffer layer 108 is required. More specifically, during the first removing process, etch stop layer 110 is too thin to block all the acid from penetrating through etch stop layer 110, and therefore polysilicon layer 106 and substrate 102 will be damaged if buffer layer 108 is not formed. As a result, buffer layer 108 is required to be formed over substrate 102 to protect polysilicon layer 106 and substrate 102 from being damaged by the acid (e.g. 20% of HF).

Figure 1H:
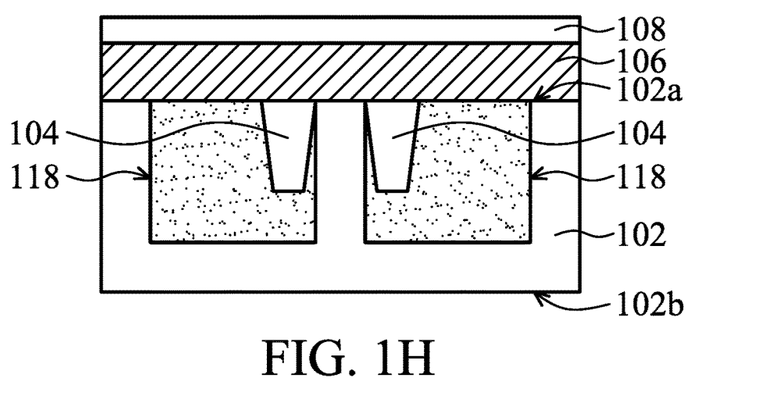

After hard mask layer 112 is removed, etch stop layer 108 is removed by a second removing process, as shown in FIG. 1H in accordance with some embodiments. In some embodiments, the second removing process includes using a solution containing $H_3PO_4$, and the concentration of $H_3PO_4$ is in a range from about 50% to about 100%.

During the second removing process, residues, such as nitride, tend to be formed. If buffer layer 108 is not formed between polysilicon layer 106 and etch stop layer 110, these residues will attach to polysilicon layer 106. However, if buffer layer 108 is formed between polysilicon layer 106 and etch stop layer 110, buffer layer 108 can be seen as a protection layer for polysilicon layer 106 when the second removing process is performed, such that the residues will attach to buffer layer 108 instead of polysilicon layer 106.

Figure 1I:
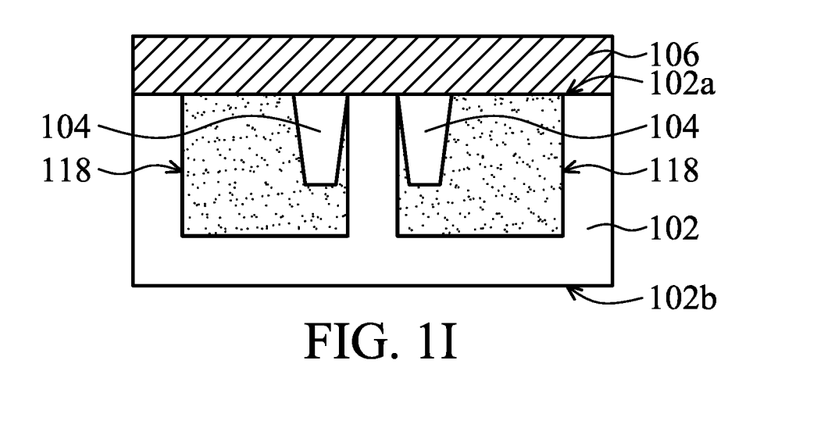

Afterwards, buffer layer 108 is removed by a third removing process, as shown in FIG. 1I in accordance with some embodiments. In some embodiments, the third removing process includes using a solution containing HF, and the concentration of HF is in a range from about 1% to about 10%. In addition, residues formed during the second removing process are removed along with buffer layer 108 during the third removing process.

Figure 1J:
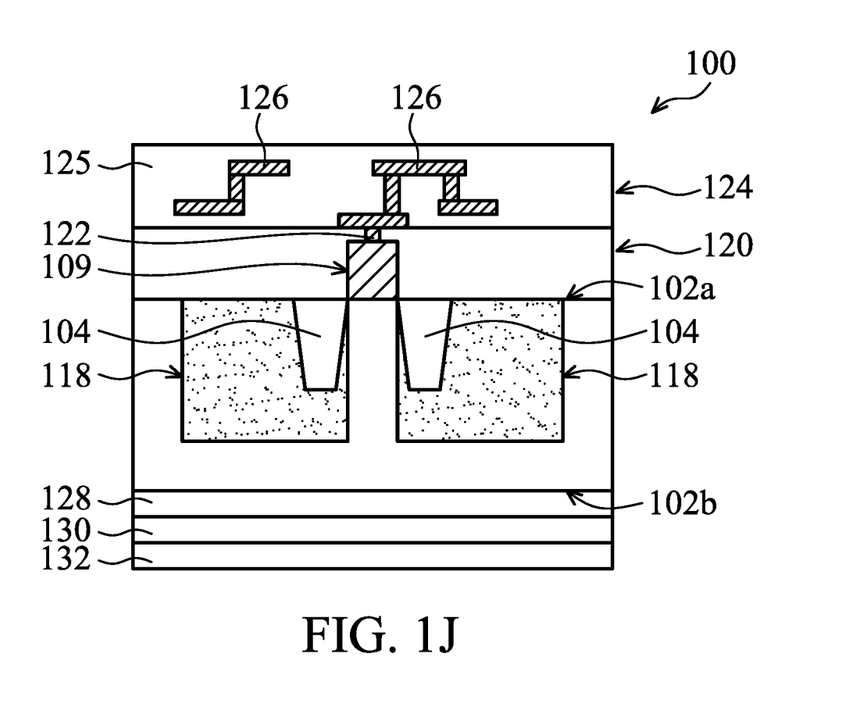

After hard mask layer 112, etch stop layer 110, and buffer layer 108 are removed, polysilicon layer 106 is patterned to form a gate structure 109, as shown in FIG. 1J in accordance with some embodiments. It should be noted that gate structure 109 may further include a gate dielectric layer (not shown). The gate dielectric layer may be made of a dielectric material, such as silicon oxide, a high-k dielectric material, or other applicable dielectric materials. Examples of high-k dielectric material may include, but are not limited to, $HfO_2$, HfSiO, HfSiON, HfTaO, HfTiO, HfZrO, zirconium oxide, aluminum oxide, or hafnium dioxide-alumina ($HfO_2$—$Al_2O_3$) alloy.

In addition, gate structure 109 may also include spacers on sidewalls of gate structure 109. The spacers may be made of a dielectric material, such as silicon nitride, silicon oxynitride, or other applicable dielectric material.

Afterwards, an inter-layer dielectric (ILD) layer 120 is formed over substrate 102 in accordance with some embodiments. In some embodiments, ILD layer 120 is made of silicon dioxide, silicon nitride, silicon oxynitride, phosphosilicate glass (PSG), borophosphosilicate glass (BPSG), fluorinated silica glass (FSG), carbon doped silicon oxide, amorphous fluorinated carbon, parylene, bis-benzocyclobutenes (BCB), polyimide, other applicable materials. ILD layer 120 may be formed by spin-on coating, CVD, sputtering, or other applicable processes. It should be noted that ILD layer 120 may be a multilayer structure.

A contact 122 coupled to gate structure 109 is formed in ILD layer 120 in accordance with some embodiments. Contact 122 may be made of any applicable conductive material, such as a highly-conductive, low-resistive metal, elemental metal, transition metal, or the like. In some embodiments, contact 120 is made of tungsten or copper.

Contact 122 may be formed through ILD layer 120 by using photolithography and etching techniques. Generally, these photolithography techniques involve depositing a photoresist material, which is masked, exposed, and developed to expose portions of ILD layer 120 which are designed to be removed. The remaining photoresist material protects the underlying material from subsequent processing steps, such as etching.

Contact 122 may further include a barrier layer (not shown) to prevent diffusion and provide better adhesion. The barrier layer may be made of titanium, titanium nitride, tantalum, tantalum nitride, or the like. The barrier layer may be formed by CVD, although other techniques could alternatively be used.

After contact 122 is formed, an interconnect structure 124 is formed over ILD layer 120, as shown in FIG. 1J in accordance with some embodiments. Interconnect structure 124 includes a dielectric layer 125 and conductive features 126 formed in dielectric layer 125. In some embodiments, dielectric layer 125 includes multilayers made of multiple dielectric materials, such as silicon oxide, silicon nitride, silicon oxynitride, tetraethoxysilane (TEOS), phosphosilicate glass (PSG), borophosphosilicate glass (BPSG), low-k dielectric material, or other applicable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. Dielectric layer 125 may be formed by CVD, PVD, atomic layer deposition (ALD), spin-on coating, or other applicable processes.

Conductive features 126 may be configured to connect various features or structures of BSI image sensor device 100. For example, conductive features 126 are used to interconnect the various devices formed on substrate 102. Conductive features 126 may be vertical interconnects, such as vias and/or contacts, and/or horizontal interconnects, such as conductive lines. In some embodiments, conductive features 126 are made of conductive materials, such as aluminum, aluminum alloy, copper, copper alloy, titanium, titanium nitride, tungsten, polysilion, or metal silicide.

In addition, a carrier substrate (not shown) may be disposed over front side 102a of substrate 102. For example, the carrier substrate may be a carrier wafer bonded to interconnect structure 124. The carrier substrate may include silicon. Alternatively, the carrier substrate may include other applicable materials, such as glass. The carrier substrate can provide protection for the various features formed on front side 102a of substrate 102 and mechanical strength and support during the processing of back side 102b of substrate (102.

An antireflective layer 128 is formed over back side 102b of substrate 102, as shown in FIG. 1J in accordance with some embodiments. In some embodiments, antireflective layer 128 is made of silicon nitride. In some embodiments, antireflective layer 128 is formed by a CVD process, such as a plasma enhanced CVD (PECVD) process.

After antireflective layer 128 is formed, a color filter layer 130 is formed over antireflective layer 128 over back side 102b of substrate 102, and microlens layer 132 is disposed over color filter layer 130, as shown in FIG. 1J in accordance with some embodiments. Color filter layer 130 may include more than one color filter. In some embodiments, color filter layer 130 includes color filters made of a dye-based (or pigment-based) polymer for filtering out a specific frequency band. In some embodiments, microlens layer 132 disposed on color filter layer 130 includes more than one microlens having a variety of shapes and sizes.

As described above, buffer layer 108 is formed between polysilicon layer 106 and etch stop layer 110 in accordance with some embodiments. Therefore, the stress between polysilicon layer 106 and etch stop layer 110 is reduced. More specifically, the stress formed between polysilicon layer 106 and etch stop layer 110 will be higher than the stress formed between polysilicon layer 106 and buffer layer 108. Therefore, when buffer layer 108 is formed between polysilicon layer 106 and etch stop layer 110, less stress will be induced. Therefore, if buffer layer 108 is not formed below etch stop layer 110, the high concentration of acid (e.g. 20% of HF) used in the first removing process will penetrate etch stop layer 110 and reach polysilicon layer 106 and substrate 102. As a result, polysilicon layer 106 will be damaged, and corrosion defects will occur on substrate 102. Accordingly, the formation of buffer layer 108 reduces damaging and corrosion defects of polysilicon layer 106 and substrate 102.

Moreover, if the acid used in the first removing process penetrates etch stop layer 110 and reaches polysilicon layer 106 and substrate 102, the acid will remain in substrate 102 during the subsequent processes, including the second removing process and the third removing process. During these processes, the acid will also gradually dissolve portions of STI 104 (e.g. oxide in STI 104), and therefore trenches will be formed at the edges, which have higher stress than the rest of the structure, of STI 104. However, since buffer layer 108 is used as a stress-release layer during the first removing process in accordance with some embodiments, damaging of STI 104 is avoided.

Furthermore, buffer layer 108 is used as a protection layer for polysilicon layer 106 during the second removing process in accordance with some embodiments. During the second removing process, residues, such as nitride particles, are formed. If buffer layer 108 is not formed over polysilicon layer 106, these residues will attach onto polysilicon layer 106 and will act as hard masks when polysilicon layer 106 is patterned. Therefore, some portions of polysilicon layer 106, which has residues remaining thereon, will remain on substrate 102 after the patterning process. However, since buffer layer 108 is used as a protection layer for polysilicon layer 106, the residues formed during the second removing process does not attach to polysilicon layer 106 but attach to buffer layer 108. Therefore, the residues can be removed by the third removing process, and polysilicon layer 106 can be patterned as per the intended design.

Embodiments of mechanisms for a BSI image sensor device structure are provided. The BSI image sensor device structure includes a buffer layer formed between a polysilicon layer and an etch stop layer over a substrate. The buffer layer is used as a stress-release layer during a first removing process for removing a hard mask layer. Therefore, damaging of the polysilicon layer and corrosion defects of the substrate are avoided. In addition, the stress induced between the polysilicon layer and the etch stop layer are reduced. Moreover, patterning of the polysilicon layer is also improved.

In some embodiments, a method for manufacturing a backside illuminated image sensor device structure is provided. The method includes forming a polysilicon layer over a front side of a substrate and forming a buffer layer over the polysilicon layer. The method further includes forming a hard mask layer having an opening over the buffer layer and performing an implant process through the opening of the hard mask layer and through the buffer layer below the opening of the hard mask layer to form a radiation sensing region in the substrate. The method further includes removing the hard mask layer and the buffer layer and patterning the polysilicon layer to form a gate structure.

In some embodiments, a method for manufacturing a backside illuminated image sensor device structure is provided. The method includes forming a polysilicon layer over a front side of a substrate and forming a buffer layer over the polysilicon layer. The method further includes forming an etch stop layer over the buffer layer and forming a hard mask layer over the etch stop layer. The method further includes patterning the hard mask layer and performing an implant process from the front side of the substrate to form a radiation sensing region in the substrate. The method further includes removing the hard mask layer, the etch stop layer, and the buffer layer and patterning the polysilicon layer to form a gate structure.

In some embodiments, a method for manufacturing a backside illuminated image sensor device structure is provided. The method includes forming a polysilicon layer over a front side of a substrate and forming a buffer layer over the polysilicon layer. The method further includes forming an etch stop layer over the buffer layer and forming a hard mask layer having an opening over the etch stop layer. The method further includes performing an implant process through the opening of the hard mask layer and through the etch stop layer below the opening of the hard mask layer and the buffer layer below the opening of the hard mask layer to form a radiation sensing region in the substrate and removing the hard mask layer, the etch stop layer, and the buffer layer. The method further includes patterning the polysilicon layer to form a gate structure.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method for manufacturing a backside illuminated image sensor device structure comprising:
   forming a polysilicon layer over a front side of a substrate;
   forming a buffer layer over the polysilicon layer;
   forming a hard mask layer over the buffer layer;
   patterning the hard mask layer;
   performing an implant process through the buffer layer to form a radiation sensing region in the substrate;
   removing the hard mask layer and the buffer layer;
   patterning the polysilicon layer to form a gate structure; and
   forming a color filter layer over a back side of the substrate.

2. The method for manufacturing the backside illuminated image sensor device structure as claimed in claim 1, wherein the buffer layer is made of silicon oxide, aluminum oxide, lanthanum oxide, hafnium oxide, zirconium oxide, hafnium oxynitride, or combinations thereof.

3. The method for manufacturing the backside illuminated image sensor device structure as claimed in claim 1, wherein a thickness of the buffer layer is in a range from about 80 Å to about 800 Å.

4. The method for manufacturing the backside illuminated image sensor device structure as claimed in claim 1, further comprising:
   forming an inter-layer dielectric layer over the front side of the substrate to cover the gate structure and the radiation sensing region.

5. The method for manufacturing the backside illuminated image sensor device structure as claimed in claim 4, further comprising:
   forming an interconnect structure over the inter-layer dielectric layer over the front side of the substrate.

6. The method for manufacturing the backside illuminated image sensor device structure as claimed in claim 5, further comprising:
   forming a micro-lens layer over the color filter layer.

7. The method for manufacturing the backside illuminated image sensor device structure as claimed in claim 1, wherein the hard mask layer is removed by a first removing process, an etch stop layer is removed by a second removing process, and the buffer layer is removed by a third removing process.

8. The method for manufacturing the backside illuminated image sensor device structure as claimed in claim 7, wherein residues formed on the buffer layer during the second removing process are removed by the third removing process.

9. A method for manufacturing a backside illuminated image sensor device structure comprising:
   forming a polysilicon layer over a front side of a substrate;
   forming a buffer layer over the polysilicon layer;
   forming a hard mask layer having an opening over the buffer layer;
   performing an implant process through the opening of the hard mask layer and through the buffer layer below the opening of the hard mask layer to form a radiation sensing region in the substrate;
   removing the hard mask layer and the buffer layer; and
   patterning the polysilicon layer to form a gate structure.

10. The method for manufacturing the backside illuminated image sensor device structure as claimed in claim 9, wherein the hard mask layer is removed by a first removing process and the buffer layer is removed by a third removing process.

11. The method for manufacturing the backside illuminated image sensor device structure as claimed in claim 10, wherein the first removing process comprises using a solution containing HF, and a concentration of HF is in a range from about 1% to about 50%.

12. The method for manufacturing the backside illuminated image sensor device structure as claimed in claim 9, further comprising:
   forming an inter-layer dielectric layer over the front side of the substrate to cover the gate structure and the radiation sensing region; and
   forming an interconnect structure over the inter-layer dielectric layer over the front side of the substrate.

13. The method for manufacturing the backside illuminated image sensor device structure as claimed in claim 12, further comprising:
  forming a color filter layer over a back side of the substrate; and
  forming a micro-lens layer over the color filter layer.

14. A method for manufacturing a backside illuminated image sensor device structure comprising:
  forming a polysilicon layer over a front side of a substrate;
  forming a buffer layer over the polysilicon layer;
  forming an etch stop layer over the buffer layer;
  forming a hard mask layer having an opening over the etch stop layer;
  performing an implant process through the opening of the hard mask layer and through the etch stop layer below the opening of the hard mask layer and the buffer layer below the opening of the hard mask layer to form a radiation sensing region in the substrate;
  removing the hard mask layer, the etch stop layer, and the buffer layer; and
  patterning the polysilicon layer to form a gate structure.

15. The method for manufacturing the backside illuminated image sensor device structure as claimed in claim 14, wherein the hard mask layer is removed by a first removing process, the etch stop layer is removed by a second removing process, and the buffer layer is removed by a third removing process.

16. The method for manufacturing the backside illuminated image sensor device structure as claimed in claim 15, wherein residues formed on the buffer layer during the second removing process are removed by the third removing process.

17. The method for manufacturing the backside illuminated image sensor device structure as claimed in claim 16, wherein the buffer layer is configured to protect the polysilicon layer from being damaged during the first removing process.

18. The method for manufacturing the backside illuminated image sensor device structure as claimed in claim 14, further comprising:
  forming an inter-layer dielectric layer over the front side of the substrate to cover the gate structure and the radiation sensing region.

19. The method for manufacturing the backside illuminated image sensor device structure as claimed in claim 18, further comprising:
  forming an interconnect structure over the inter-layer dielectric layer over the front side of the substrate.

20. The method for manufacturing the backside illuminated image sensor device structure as claimed in claim 19, further comprising:
  forming a color filter layer over a back side of the substrate; and
  forming a micro-lens layer over the color filter layer.

* * * * *